(12) United States Patent
Jeanjean

(10) Patent No.: US 7,730,251 B2
(45) Date of Patent: Jun. 1, 2010

(54) SUPPORT IDENTIFICATION DEVICE

(75) Inventor: François Jeanjean, Wemmel (BE)

(73) Assignee: Alcatel Lucent, Paris (FR)

( * ) Notice: Subject to any disclaimer, the term of this patent is extended or adjusted under 35 U.S.C. 154(b) by 1192 days.

(21) Appl. No.: 11/296,451

(22) Filed: Dec. 8, 2005

(65) Prior Publication Data
US 2006/0129653 A1 Jun. 15, 2006

(30) Foreign Application Priority Data
Dec. 13, 2004 (EP) .................................. 04292971

(51) Int. Cl.
*G06F 13/00* (2006.01)
*G06F 13/10* (2006.01)
*H05K 7/10* (2006.01)
*H03K 19/00* (2006.01)
*G06F 13/14* (2006.01)

(52) U.S. Cl. .................... 710/300; 710/301; 326/59

(58) Field of Classification Search .............. 710/104, 710/300–301; 326/59–60
See application file for complete search history.

(56) References Cited

U.S. PATENT DOCUMENTS

| 5,948,075 | A | 9/1999 | Osten | |
|---|---|---|---|---|
| 6,438,625 | B1 | 8/2002 | Olson | |
| 6,564,278 | B1 * | 5/2003 | Olson | 710/301 |
| 6,640,272 | B1 | 10/2003 | Hartwell et al. | |
| 6,760,785 | B1 | 7/2004 | Powderly et al. | |
| 7,550,997 | B2 * | 6/2009 | Gruijl | 326/60 |
| 2008/0211543 | A1 * | 9/2008 | Gruijl | 326/93 |
| 2009/0172234 | A1 * | 7/2009 | Ji et al. | 710/300 |

FOREIGN PATENT DOCUMENTS
EP 1 146 429 A1 10/2001

* cited by examiner

*Primary Examiner*—Ryan M Stiglic
(74) *Attorney, Agent, or Firm*—Harness, Dickey & Pierce

(57) ABSTRACT

A support identification device comprising a support (BPA), e.g. a rack or backplane of a telecommunication system, and an identity receiver (PCB), e.g. a printed circuit board or card, coupled to an identity transmitter or connector of the support. The identity transmitter has several read pins (id1-id4=R1-R4) each at a logical level (0, 1) to indicate (identify) the type of support. The card (PCB) further has write terminals (W1, W2) coupled to dynamic terminals (D1, D2) of the support (BPA). These dynamic terminals are coupled to one or more of the read pins (id1-id4). The card is also provided with a program that sets the write terminals at a first logical level, reads a first logical level at each read pin (R1-R4), then sets the write terminals at a second logical level, reads a second logical level at each read pin, and determines from the difference between the first and the second read logical levels to which write terminal each read terminal is coupled, or not. This allows to obtain $(2+w)^n$ identifications with n read pins and w write pins, instead of $2^{n+w}$ identifications with the same total number n+w of read or basic pins.

13 Claims, 3 Drawing Sheets

|  | Number of Write Terminals | | | | | | | | | |
|---|---|---|---|---|---|---|---|---|---|---|
| Total number of Terminals | 0 | 1 | 2 | 3 | 4 | 5 | 6 | 7 | 8 | 9 |
| 1 | 2 | 0 | 0 | 0 | 0 | 0 | 0 | 0 | 0 | 0 |
| 2 | 4 | 3 | 0 | 0 | 0 | 0 | 0 | 0 | 0 | 0 |
| 3 | 8 | Current | 0 | 0 | 0 | 0 | 0 | 0 | 0 | 0 |
| 4 | 16 | 9 | 0 | 0 | 0 | 0 | 0 | 0 | 0 | 0 |
| 5 | 32 | 27 | 0 | 0 | 0 | 0 | 0 | 0 | 0 | 0 |
| 6 | 64 | 81 | 64 | 0 | 0 | 0 | 0 | 0 | 0 | 0 |
| 7 | 128 | 243 | 256 | 0 | 0 | 0 | 0 | 0 | 0 | 0 |
| 8 | 256 | 729 | 1 024 | 625 | 0 | 0 | 0 | 0 | 0 | 0 |
| 9 | 512 | 2 187 | 4 096 | 3 125 | 776 | 0 | 0 | 0 | 0 | 0 |
| 10 | 1 024 | 6 561 | 16 384 | 15 625 | 46 656 | 2 401 | 0 | 81 | 0 | 0 |
| 11 | 2 048 | 19 683 | 65 536 | 78 125 | 279 936 | 16 807 | 512 | 729 | 10 | 121 |
| 12 | 4 096 | 59 049 | 262 144 | 390 625 | 279 936 | 117 649 | 4 096 | 6 561 | 100 | 1 331 |
| 13 | 8 192 | 177 147 | 1 048 576 | 1 953 125 | 1 679 616 | 823 543 | 32 768 | 59 049 | 1 000 | 14 641 |
| 14 | 16 384 | 531 441 | 4 194 304 | 9 765 625 | 10 077 696 | 5 764 801 | 262 144 | 531 441 | 10 000 | 161 051 |
| 15 | 32 768 | 1 594 323 | 16 777 216 | 48 828 125 | 60 466 176 | 40 353 607 | 2 097 152 | 4 782 969 | 100 000 | 1 771 561 |
| 16 | 65 536 | 4 782 969 | 67 108 864 | 244 140 625 | 362 797 056 | 282 475 249 | 16 777 216 | 43 046 721 | 1 000 000 | 19 487 171 |
| 17 | ### | 14 348 907 | 268 435 456 | 1 220 703 125 | 2 176 782 336 | 1 977 326 743 | 134 217 728 | 387 420 489 | 10 000 000 | 214 358 881 |
| 18 | ### | 43 046 721 | 1 048 576 | 6 103 515 625 | ######## | ######## | 1 073 741 824 | 3 486 784 401 | 100 000 000 | 2 357 947 691 |
| 19 | ### | ### | ######## | ######## | ######## | ######## | 8 589 934 592 | 43 046 721 ##### | 1 000 000 000 | ######## |
| 20 | ### | ### | ######## | ######## | ######## | ######## | ######## | ######## | ######## | ######## |
| 21 | ### | ### | ######## | ######## | ######## | ######## | ######## | ######## | ######## | ######## |
| 22 | ### | ### | ######## | ######## | ######## | ######## | ######## | ######## | ######## | ######## |
| 23 | ### | ### | ######## | ######## | ######## | ######## | ######## | ######## | ######## | ######## |

New SW, same HW

Adding 2 read and 2 write bits to 2write+ 8read (10total) means going to 4write+ 10read = 14 total

Fig. 3

SUPPORT IDENTIFICATION DEVICE

FIELD OF THE INVENTION

The present invention relates to a support identification device comprising a support and an identity receiver adapted to be coupled to an identity transmitter of said support, said identity transmitter having a plurality of identity transmitter terminals each at a predetermined logical level and adapted to be coupled to respective identity receiver terminals of said identity receiver.

BACKGROUND OF THE INVENTION

Such a support identification device is generally known in the art. Therein, the identity transmitter terminals of the support are all set to a logical level 0 or 1 so that they together correspond to an identity that can be recognized by the identity receiver coupled thereto. An example of such a support identification device is a rack or a backplane, e.g. of a telecommunication system, with a connector comprising the identity transmitter terminals or pins to which a corresponding connector of a printed circuit board able to be inserted in the rack can be coupled as the identity receiver.

When the printed circuit board or card is inserted into the support or rack, the identity transmitter terminals or pins of the rack connector identify the type of rack; each pin is hardware-wired to the ground or to a voltage terminal, e.g. Vcc (logical level 0 or 1). As example, n=4 pins could be used to this end. The support identification is then limited to $2^n=2^4=16$ types of supports or racks.

A first solution to increase the number of possible identification types is to increase the number of identity transmitter terminals or pins. However, there will always be a physical limitation to the number of available pins.

Another solution is to place a serial interface, e.g. to connect the pins to a serial PROM in the support. However, the support or rack is not adapted to receive an active device or card.

SUMMARY OF THE INVENTION

An object of the present invention is to provide a support identification device of the above known type but wherein the number of possible identifications of the support is increased while not dramatically increasing the number of identity transmitter terminals.

According to the invention, this object is achieved due to the fact that said identity receiver is provided with at least one write terminal adapted to be coupled to a corresponding dynamic terminal of said support, that said dynamic terminal is adapted to be coupled to at least one transmitter terminals of said identity transmitter, and that said identity receiver is further provided with program means adapted:

to set said write terminal at a first logical level,
to read a first logical level at each identity receiver terminal of said plurality,
to set said write terminal at a second logical level,
to read a second logical level at each identity receiver terminal, and
to determine from the difference between the first read logical level and the second read logical level at each identity receiver terminal whether said identity receiver terminal is coupled to said write terminal.

In this way, each dynamic terminal of the support may be hardware-wired either to none, one or more of the identity receiver terminals. The logical level of each write terminal, also called extra write pin, is provided in 2 steps by the identity receiver or printed circuit board. An identity transmitter terminal may thus have 3 (virtual) logical level: 0, 1 or D; D being an indication that this terminal is not hardware-wired to the ground or to a voltage terminal, e.g. Vcc, but is connected to a dynamic terminal. In other words, the extra write pin creates a third logical level for one or more of the n basic pins or identity transmitter terminals.

As a result, the write terminals or extra write pins allow creating more than $2^n=2^4=16$ support identifications, in case of n=4 basic identification pins. Indeed, 1 write terminal or extra write pin already allows $(1+2)^n=(1+2)^4=81$ identifications, instead of $2^{n+1}=2^5=32$ identifications in case n+1=5 identity receiver terminals or basic pins.

Another advantage of the present invention is that the reliability of the support or backplane is improved by not using any active card therein, the only program means is located in the identity receiver or printed circuit board.

Another characterizing embodiment of the present invention is that, in case said identity receiver is provided with a plurality of write terminals, said program means is adapted
to set each write terminal at a predetermined first logical level,
to read a first logical level at each identity receiver terminal of said plurality,
to set each write terminal at a predetermined second logical level,
to read a second logical level at each identity receiver terminal, and
to determine from the difference between the first read logical level and the second read logical level at each identity receiver terminal to which write terminal said identity receiver terminal is coupled.

In case of 2 write terminals, the their logical levels will be set to 01 for the first read operation, and to 10 for the second read operation.

To go further with the example given above, n=4 identity receiver terminals and w=2 write terminals allow $(2+2)^n=(2+2)^4=256$ identifications, instead of $2^{n+2}=2^6=64$ identifications in case of n+2=6 identity receiver terminals. And so further: 7 identity receiver terminals and 3 write terminals allow 78,125 identifications, instead of 1,024 with 10 identity receiver terminals or basic pins.

The above examples show that the number of pins used to identify the support remains reduced, even for a very high number of possible support identities.

Although the above explanation of the support identification device has been made with a rack or backplane and a printed circuit board, the present invention also suits to other applications such as for instance the Internet Protocols IPv4, IPv6 and the MAC address code. In such applications, the identity receiver terminals and write terminals are bits, e.g. of a TCP/IP address. The results are:

the number of possible identifications with the 32 bits of IPv4, i.e. $2^{32}=4\ 294\ 967\ 296$, can already be reached with 18 bits (16 identity receiver terminals and 2 write terminals) if the present invention is used;
the number of possible identifications with the 48 bits of Mac@, i.e. $2^{48}=2.81475\ E+14$, can be reached with 22 bits (16 identity receiver terminals and 6 write terminals) if the present invention is used; and
the number of possible identifications with the 128 bits of IPv6, i.e. $2^{128}=3.40282\ E+38$, can be reached with 46 bits if the present invention is used.

It is to be noted that in case of said identity receiver is provided with more than two write terminals, further processing steps may be necessary.

As will be explained in the description below, 2 processing steps are required if 1 or 2 write terminals are used, 3 processing steps are required if 2 to 6 write terminals are used, 4 processing steps are required from 7 write terminals, etc. . . .

The present invention also relates to a method to identify a support by an identity receiver coupled to an identity transmitter of said support, said identity transmitter having a plurality of identity transmitter terminals each at a predetermined logical level and coupled to respective identity receiver terminals of said identity receiver.

A further object of the present invention is to provide such a method wherein the number of possible identifications of the support is large while not dramatically increasing the number of identity transmitter terminals.

According to the invention, this object is achieved due to the fact that said identity receiver is provided with at least one write terminal coupled to a corresponding dynamic terminal of said support, that said dynamic terminal is coupled to at least one transmitter terminals of said identity transmitter, and that said method comprises the steps of setting said write terminal at a first logical level, reading a first logical level at each identity receiver terminal of said plurality, setting said write terminal at a second logical level, reading a second logical level at each identity receiver terminal, and determining from the difference between the first read logical level and the second read logical level at each identity receiver terminal whether the read logical level is received from said write terminal.

In this way, the difference between the first and the second read logical level indicates whether the identity receiver terminal is coupled to the dynamic terminal or not. If it is, this identity receiver terminal may receive a third logical level, in addition to the classical 0 and 1. This third level dramatically increases the number of possible support identifications to a value larger than $2^n$, wherein n is the number of terminals.

Further characterizing embodiments of the present support identification device and of the method to identify a support applicable to this support identification device are mentioned in the appended claims.

It is to be noticed that the term 'comprising', used in the claims, should not be interpreted as being restricted to the means listed thereafter. Thus, the scope of the expression 'a device comprising means A and B' should not be limited to devices consisting only of components A and B. It means that with respect to the present invention, the only relevant components of the device are A and B.

Similarly, it is to be noticed that the term 'coupled', also used in the claims, should not be interpreted as being restricted to direct connections only. Thus, the scope of the expression 'a device A coupled to a device B' should not be limited to devices or systems wherein an output of device A is directly connected to an input of device B. It means that there exists a path between an output of A and an input of B which may be a path including other devices or means.

The above and other objects and features of the invention will become more apparent and the invention itself will be best understood by referring to the following description of an embodiment taken in conjunction with the accompanying drawings wherein:

BRIEF DESCRIPTION OF THE DRAWINGS

FIG. 3 is a table showing the number of possible identifications obtained in function of the number of write terminals (W . . . ) used with respect to the total number of terminals (W . . . +R . . . or D . . . +id . . . ).

DETAILED DESCRIPTION

Figure 1:
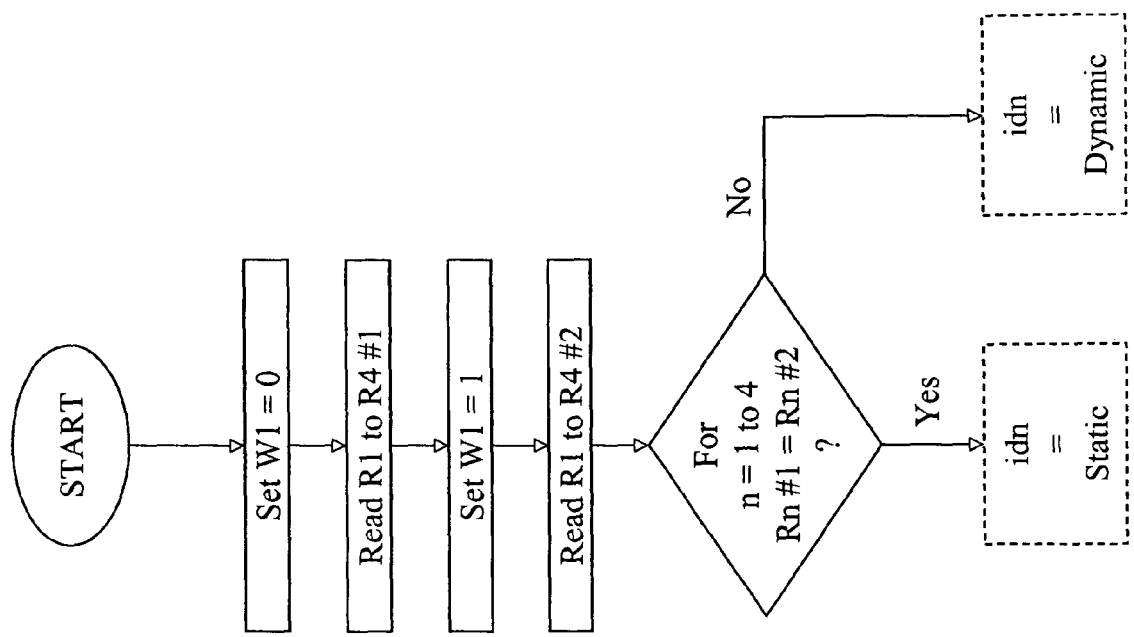
FIG. 1 represents a support identification device and a method to identify a support (BPA) according to the present invention.
Figure 1:
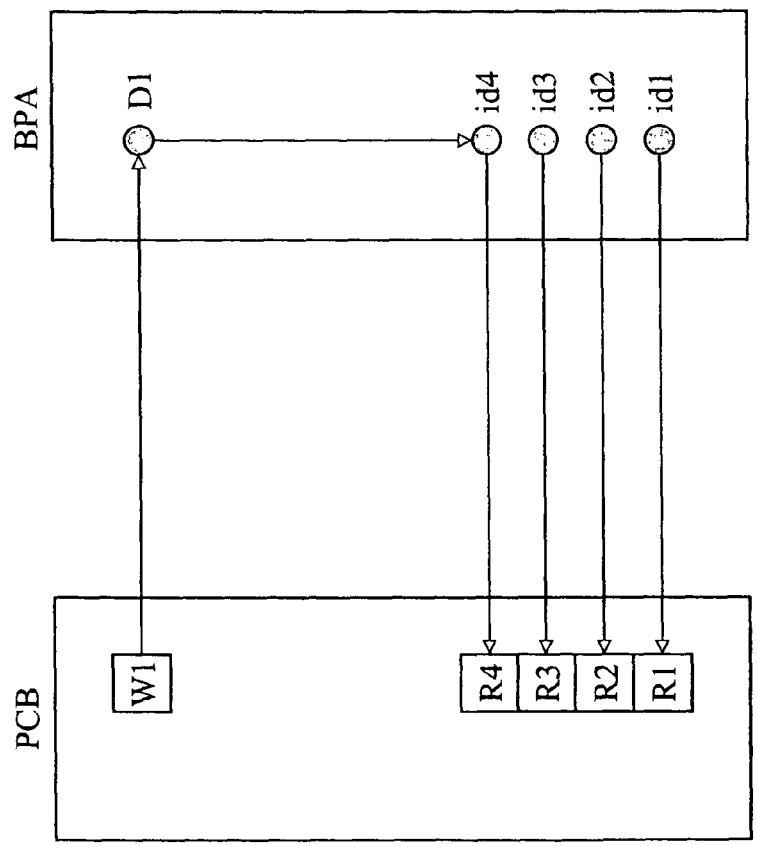

The support identification device shown at FIG. 1 is for instance used in a telecommunication system to identify the type of support, which may be a backplane or rack BPA, by a printed circuit board or card PCB.

The backplane BPA has an identity transmitter that is a connector with identity transmitter terminals or pins, e.g. the n=4 pins id1 to id4. Each pin id1-id4 is hardware-wired either to the ground (logical level 0), to a voltage terminal, e.g. Vcc not shown (logical level 1), or to another terminal D1, hereafter called dynamic terminal. The dynamic terminal D1 may be an additional pin in the connector of the backplane or may be separated from it.

The printed circuit board PCB is provided with an identity receiver having n=4 identity receiver terminals R1 to R4 and a write terminal W1. The identity receiver is a connector of which, when the printed circuit board PCB is inserted in the backplane BPA, the terminals R1-R4 and W1 are in contact with the contacts id1-id4 and D1 respectively of the identity transmitter.

The purpose of the identity transmitter is to indicate the type of backplane BPA to the printed circuit board PCB. Without the write W1 and dynamic D1 terminals, the n=4 identity transmitter terminals id1-id4 allow to identify $2^n=2^4=16$ different types of backplanes, because of the only 2 available logical levels 0 and 1.

The printed circuit board PCB is further provided with a program that transmits logical levels 0 or 1 to the write terminal W1 as will be explained below. This program may for instance be part of a program that reads the logical levels at the identity receiver terminals R1-R4 to determine the type of backplane.

The program performs successively the following main operations:

set the write terminal W1 at a first logical level, e.g. 0 as indicated in the flowchart at the right of FIG. 1;

read a first logical level at each identity receiver terminal R1-R4. This means that the logical level read at the identity transmit terminal id4 should be 0, whilst the logical levels read at the other identity transmit terminal id1 to id3 depend of their hardware wiring and remain fixed;

set the write terminal W1 at a second logical level, i.e. 1 as indicated at FIG. 1;

read a second logical level at each identity receiver terminal R1-R4. The logical level read at the identity transmit terminal id4 should now be 1, whilst the logical levels read at the other identity transmit terminals id1 to id3 remain unchanged; and determine from the difference between the first read logical levels and the second read logical levels at each identity receiver terminal id1-id4 whether the identity receiver terminal is coupled to the write terminal W1 or not. Here, only the logical value at the identity transmit terminal id4 has changed from 0 to 1, which means that only this identity transmit terminal id4 is connected to the dynamic terminal D1.

In the example of FIG. 1, the dynamic terminal D1 is only wired to the identity transmitter terminal id4. This dynamic terminal D1 may for instance also be connected to other identity transmitter terminals, to several or to none of them.

This allows thus each identity transmitter terminal id1-id4 to have 3 logical levels 0, 1 or D. The maximum number of possible identities with n=4 identity transmitter terminals or basic pins then becomes $(2+1)^n=(1+2)^4=81$ identifications, instead of the above 16 identifications of different types of backplanes. In fact, if the write terminal W1 should be considered as being a "basic" identity transmit terminal or pin of the connector, the possible number of identifications with a prior art device should then be $2^{n+1}=2^5=32$ identifications, with n+1=5 basic pins in total. This is still dramatically smaller than the maximum of 81 identifications obtained with the present invention.

The difference even increases by increasing the number of write terminals as will be explained below by making reference to FIG. 2 wherein 2 write terminals W1 and W2 are provided.

Figure 2:
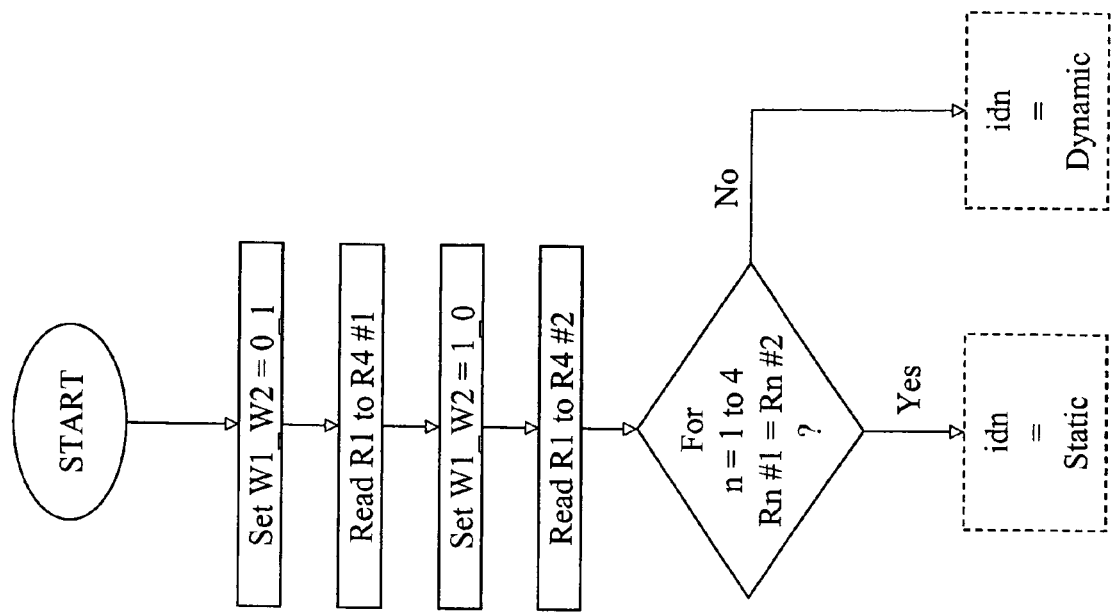
FIG. 2 represents a variant of the support identification device and method of FIG. 1 with more write terminals (W1, W2) in the identity receiver (PCB)
Figure 2:
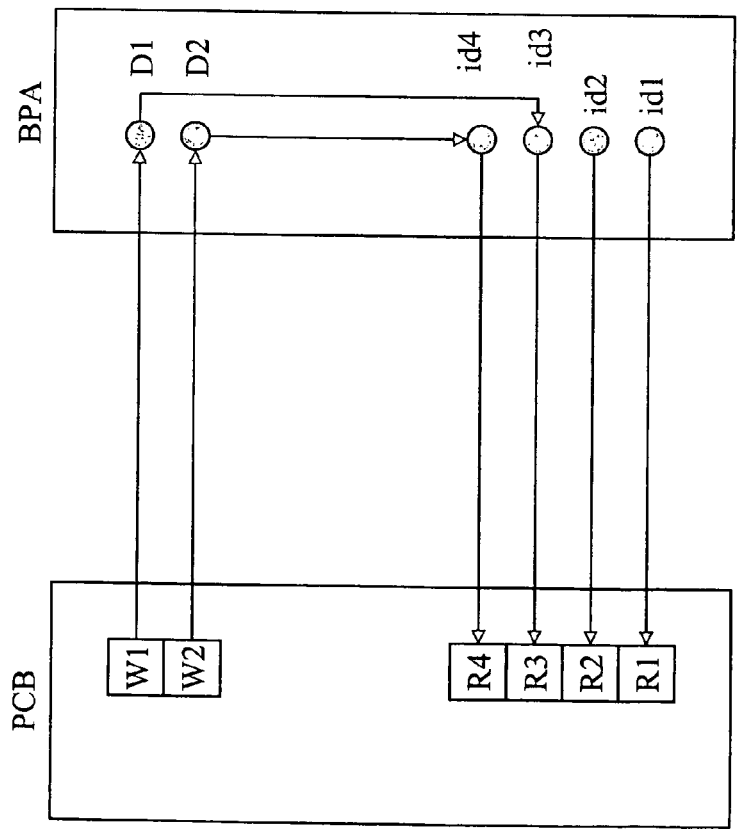

In the example of FIG. 2, the dynamic terminal D1 is wired to the identity transmitter terminal id3, whilst the dynamic terminal D2 is wired to the identity transmitter terminal id4. These dynamic terminals D1 and D2 may for instance also be connected to other identity transmitter terminals, to several or to none of them.

In this second example, the program of the printed circuit board PCB performs successively the following main operations:

set the write terminals W1 and W2 at a first respective logical level, e.g. 0 for W1 and 1 for W2 as indicated in the flowchart at the right of FIG. 2;

read a first logical level at each identity receiver terminal R1-R4. This means that the logical levels read at the identity transmit terminals id3 and id4 should be 0 and 1 respectively, whilst the logical levels read at the other identity transmit terminal id1 and id2 depend of their hardware wiring and remain fixed;

set the write terminals W1 and W2 at a second respective logical level, i.e. 1 for W1 and 0 for W2 as indicated at FIG. 2;

read a second logical levels at each identity receiver terminal R1-R4. The logical levels read at the identity transmit terminals id3 and id4 should now be 1 and 0 respectively, whilst the logical levels read at the other identity transmit terminals id1 and id2 remain unchanged; and determine from the difference between the first read logical levels and the second read logical levels at each identity receiver terminal id1-id4 whether the identity receiver terminal is coupled to the write terminal W1, W2 or not. Here, the logical values at the identity transmit terminals id3 and id4 have changed, which means that these identity transmit terminals id3 and id4 are connected to dynamic terminals.

By this second example, it appears that with n=4 identity transmitter terminals or basic pins id1 to id4 and w=2 write terminals or pins W1 and W2, $(2+w)^n=(2+2)^4=256$ identifications are obtained instead of $2^{n+w}=2^{4+2}=2^6=64$ identifications in a former device with n+2=6 basic pins.

In case that more than 2 write terminals are used, the number of steps performed by the program will increase. More generally, two write steps are needed in case of 1 or 2 extra terminals as explained above, three write steps are needed in case of 3 to 6 extra pins, etc. . . .

Summarizing, n identity receiver terminals or read pins and w write terminals or write pins allow $(2+w)^n$ identifications, instead of $2^{n+w}$ identifications in case of n+w identity receiver terminals or basic pins.

FIG. 3 gives a table wherein are indicated the number of possible identifications in function of the number of write terminals (Wx) with respect to the total number of terminals, i.e. the number of basic pins or identity transmitter terminals, also called read pins, (idn) added to the number of write terminals (Wx).

As a further example, 7 basic pins and 3 write pins, i.e. a total of 10 pins (row 10 at FIG. 3), allow 78 125 identifications (column 3), instead of 1 024 identifications with 10 basic pins and no write pin (row 10, column 0).

A final remark is that embodiments of the present invention are described above in terms of functional blocks. From the functional description of these blocks, given above, it will be apparent for a person skilled in the art of designing electronic devices how embodiments of these blocks can be manufactured with well-known electronic components. A detailed architecture of the contents of the functional blocks hence is not given.

While the principles of the invention have been described above in connection with specific apparatus, it is to be clearly understood that this description is merely made by way of example and not as a limitation on the scope of the invention, as defined in the appended claims.

The invention claimed is:

1. A support identification device comprising a support and an identity receiver adapted to be coupled to an identity transmitter of said support, said identity transmitter having a plurality of identity transmitter terminals each at a predetermined logical level and adapted to be coupled to respective identity receiver terminals of said identity receiver, wherein said identity receiver is provided with at least one write terminal adapted to be coupled to a corresponding dynamic terminal of said support, wherein said dynamic terminal is adapted to be coupled to at least one transmitter terminal of said identity transmitter, and wherein said identity receiver is further provided with program means adapted to set said write terminal at a first logical level, to read a first logical level at each identity receiver terminal of said plurality, to set said write terminal at a second logical level, to read a second logical level at each identity receiver terminal, and to determine from the difference between the first read logical level and the second read logical level at each identity receiver terminal whether said identity receiver terminal is coupled to said write terminal.

2. The support identification device according to claim 1, wherein, in case said identity receiver is provided with a plurality of write terminals, said program means is adapted to set each write terminal at a predetermined first logical level, to read a first logical level at each identity receiver terminal of said plurality, to set each write terminal at a predetermined second logical level, to read a second logical level at each identity receiver terminal, and to determine from the difference between the first read logical level and the second read logical level at each identity receiver terminal to which write terminal said
identity receiver terminal is coupled.

3. The support identification device according to claim 2, wherein, in case said identity receiver is provided with more than two write terminals, said program means is further adapted
to set each write terminal at further predetermined first logical levels,
to read further first logical levels at each identity receiver terminal of said plurality,
to set each write terminal at further predetermined second logical levels,
to read further second logical levels at each identity receiver terminal, and
to determine from the differences between the first, second and further read logical levels at each identity receiver terminal to which write terminal said identity receiver terminal is coupled.

4. The support identification device according to claim 1, wherein each dynamic terminal is adapted to be simultaneously coupled to several identity transmitter terminals of said identity transmitter.

5. The support identification device according to claim 1, wherein the number of write terminals is equal to the number of dynamic terminals, and wherein each dynamic terminal is adapted to be coupled to at least one identity transmitter terminal of said identity transmitter.

6. The support identification device according to claim 1,
wherein said identity receiver and said identity transmitter are matching connectors of which said identity receiver terminals and said identity transmitter terminals are respective contacts.

7. The support identification device according to claim 6, wherein said write terminals are contacts associated to said identity receiver terminals in a first same connector, and wherein said dynamic terminals are contacts associated to said identity transmitter terminals in a second same connector.

8. The support identification device according to claim 1,
wherein said support is a back-plane of a telecommunication system, in that said identity receiver and said write terminals belong to a printed circuit board adapted to be coupled to said support, and in that said identity transmitter and said dynamic terminals allow said printed circuit board to identify said support.

9. A method to identify a support by an identity receiver coupled to an identity transmitter of said support, said identity transmitter having a plurality of identity transmitter terminals each at a predetermined logical level and coupled to respective identity receiver terminals of said identity receiver,
wherein said identity receiver is provided with at least one write terminal coupled to a corresponding dynamic terminal of said support,
wherein said dynamic terminal is coupled to at least one transmitter terminal of said identity transmitter, and
wherein said method comprises the steps of
setting said write terminal at a first logical level, reading a first logical level at each identity receiver terminal of said plurality,
setting said write terminal at a second logical level,
reading a second logical level at each identity receiver terminal, and
determining from the difference between the first read logical level and the second read logical level at each identity receiver terminal whether the read logical level is received from said write terminal.

10. The method according to claim 9, wherein a logical level applied to a write terminal is transmitted to one or more identity transmitter terminals of said identity transmitter.

11. The method according to claim 9, wherein, in case a plurality of write terminals are used, said method comprises the steps of
setting each write terminal at a predetermined first logical level,
reading a first logical level at each identity receiver terminal of said plurality,
setting each write terminal at a predetermined second logical level,
reading a second logical level at each identity receiver terminal, and
determining from the difference between the first read logical level and the second read logical level at each identity receiver terminal from which write terminal the read logical level is received.

12. The method according to claim 11, wherein, in case said identity receiver is provided with more than two write terminals, said method comprises further steps of
setting each write terminal at further predetermined first logical levels,
reading further first logical levels at each identity receiver terminal of said plurality,
setting each write terminal at further predetermined second logical levels,
reading further second logical levels at each identity receiver terminal, and
determining from the differences between the first, second and further read logical levels at each identity receiver terminal from which write terminal the read logical level is received.

13. The method according to claim 9,
wherein each write terminals is coupled to distinct dynamic terminals, and in that the logical level at each write terminal is transmitted to at least one identity transmitter terminal of said identity transmitter.

* * * * *